(12) United States Patent
Qu et al.

(10) Patent No.: US 8,836,072 B2
(45) Date of Patent: Sep. 16, 2014

(54) SEMICONDUCTOR SYSTEM INCLUDING A SCHOTTKY DIODE

(75) Inventors: Ning Qu, Reutlingen (DE); Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 135 days.

(21) Appl. No.: 13/382,982

(22) PCT Filed: Jun. 9, 2010

(86) PCT No.: PCT/EP2010/058060
§ 371 (c)(1),
(2), (4) Date: Jun. 15, 2012

(87) PCT Pub. No.: WO2011/015393
PCT Pub. Date: Feb. 10, 2011

(65) Prior Publication Data
US 2012/0241897 A1   Sep. 27, 2012

(30) Foreign Application Priority Data

Aug. 5, 2009 (DE) .......................... 10 2009 028 252

(51) Int. Cl.
*H01L 29/66* (2006.01)
(52) U.S. Cl.
USPC ................... 257/476; 257/109; 257/E27.051; 438/576
(58) Field of Classification Search
CPC ............ H01L 29/0619; H01L 29/0634; H01L 29/66143; H01L 29/872
USPC .................. 438/478, 430, 576; 257/476, 109, 257/E27.051
See application file for complete search history.

(56) References Cited

U.S. PATENT DOCUMENTS

| | | | |
|---|---|---|---|
| 6,404,032 B1 | 6/2002 | Kitada et al. | |
| 7,902,626 B2 * | 3/2011 | Goerlach et al. | 257/476 |
| 7,964,930 B2 * | 6/2011 | Goerlach et al. | 257/471 |
| 8,497,563 B2 * | 7/2013 | Qu et al. | 257/481 |
| 2008/0197439 A1 | 8/2008 | Goerlach et al. | |
| 2012/0187521 A1 * | 7/2012 | Qu et al. | 257/476 |

FOREIGN PATENT DOCUMENTS

| | | |
|---|---|---|
| CN | 1851923 | 10/2006 |
| DE | 19820734 | 11/1999 |
| DE | 102004053761 | 5/2006 |
| DE | 102007045185 | * 4/2009 |
| EP | 1139433 | 10/2001 |

(Continued)

OTHER PUBLICATIONS

International Search Report, PCT International Application No. PCT/EP2010/058060, dated Sep. 21, 2010.
H. Kozaka et al., "Low leakage current Schottky barrier diode," *Proceedings of 1992 International Symposium on Power Semiconductors & ICs*, Tokyo, pp. 80-85 (1992).

*Primary Examiner* — Jose R Diaz
(74) *Attorney, Agent, or Firm* — Kenyon & Kenyon LLP

(57) ABSTRACT

A semiconductor system is described, which includes a trench junction barrier Schottky diode having an integrated p-n type diode as a clamping element, which is suitable for use in motor vehicle generator system, in particular as a Zener diode having a breakdown voltage of approximately 20V. In this case, the TJBS is a combination of a Schottky diode and a p-n type diode. Where the breakdown voltages are concerned, the breakdown voltage of the p-n type diode is lower than the breakdown voltage of Schottky diode. The semiconductor system may therefore be operated using high currents at breakdown.

11 Claims, 3 Drawing Sheets

(56) References Cited

FOREIGN PATENT DOCUMENTS

| JP | 7-226521 | 8/1995 |
| JP | 63-164263 | 7/1998 |
| JP | 2001-85704 | 3/2001 |
| JP | 2001-284604 | 10/2001 |
| JP | 2004-509452 | 3/2004 |
| JP | 2008-519447 | 6/2008 |
| JP | 2008-519448 | 6/2008 |
| WO | WO 2009/040265 | 4/2009 |

* cited by examiner

SEMICONDUCTOR SYSTEM INCLUDING A SCHOTTKY DIODE

FIELD OF THE INVENTION

The present invention relates to variants of trench junction barrier Schottky diodes, which are referred below simply as TJBS.

BACKGROUND INFORMATION

TJBS diodes offer greater flexibility for component design and are suitable, in particular, as Zener power diodes having a breakdown voltage of approximately 20V for use in motor vehicle generator systems.

More and more functions in modern motor vehicles are being performed by electrical components. This results in an ever higher demand for electrical power. To meet this demand, the efficiency of the generator system in the motor vehicle must be increased.

Until now, p-n type diodes have ordinarily been used as Zener diodes in motor vehicle generator systems. The advantages of p-n type diodes are a low reverse current, on the one hand, and high robustness, on the other hand. The main disadvantage is a high forward voltage UF. At room temperature, current begins to flow only at UF=0.7V. Under normal operating conditions, e.g., a current density of 500 A/cm$^2$, UF increases to over 1V, which means a not inconsiderable loss in efficiency.

Theoretically, Schottky diodes are available as an alternative. Schottky diodes have a much lower forward voltage than p-n type diodes, for example 0.5V to 0.6V at a high current density of 500 A/cm$^2$. As majority carrier components, Schottky diodes also have advantages in rapid switching operation. However, Schottky diodes have not yet been used in motor vehicle generator systems. This circumstance is attributable to a number of important disadvantages of Schottky diodes: 1) higher reverse current compared to p-n type diodes; 2) great dependency of the reverse current on reverse voltage; and 3) poor robustness, in particular at high temperatures.

Ways to improve Schottky diodes have already been proposed. Two examples are listed below. JBS (junction barrier Schottky diode), which is described in S. Kunori, et al., "Low leakage current Schottky barrier diode," *Proceedings of 1992 International Symposium on Power Semiconductors & ICs*, Tokyo, pp. 80-85.

As shown in FIG. 1, the JBS includes an n$^+$-type substrate 1, an n-type epilayer 2, at least two p-type wells 3, which are diffused into n-type epilayer 2, and metal layers on front 4 and back 5 of the chip. From an electrical point of view, the JBS is a combination of a p-n type diode having a p-n junction between p-type wells 3 as the anode and n-type epilayer 2 as the cathode, and a Schottky diode having a Schottky barrier between metal layer 4 as the anode and n-type epilayer 2 as the cathode. The metal layer on the back of chip 5 acts as a cathode electrode, while the metal layer on the front of chip 4 acts as an anode electrode having an ohmic contact to p-type wells 3 and, at the same time, as a Schottky contact to n-type epilayer 2.

Due to the low forward voltage of the Schottky diode, compared to the p-n type diode, currents flow only through the area of the Schottky diode in the forward direction. As a result, the effective area (per unit of area) for the flow of current in the forward direction is much smaller in a JBS than in a conventional planar Schottky diode.

In the reverse direction, the space charge zones expand as the voltage increases and converge in the middle of the area between adjacent p-type wells 3 at a voltage which is lower than the breakdown voltage of the JBS. This partially shields the Schottky effect, which is responsible for the high reverse currents, and reduces the reverse current. This shielding effect is highly dependent on the structural parameters of penetration depth of p-type diffusion Xjp, the distance between p-type wells Wn and the width of p-type well Wp as well as on the doping concentrations of p-type well 3 and n-type epilayer 2 (see FIG. 1).

Conventionally, the p-type wells of a JBS are implemented by p-type implantation followed by p-type diffusion. Lateral diffusion in the x direction, whose depth is comparable to the vertical diffusion in the y direction, results in cylindrical p-type wells in the two-dimensional representation (infinite length in the z direction perpendicular to the x-y plane), whose radius corresponds to penetration depth Xjp. Due to the radial expansion of the space charge zones, this form of p-type wells does not demonstrate a very effective shielding of the Schottky effect. It is not possible to strengthen the shielding effect solely with the aid of a deeper p-type diffusion, since the lateral diffusion becomes correspondingly wider at the same time. Reducing the distance between p-type wells Wn is also not a good approach, since, while this strengthens the shielding effect, it also further reduces the effective area for current flow in the forward direction.

An alternative for improving the shielding action of the Schottky effect or the barrier-lowering effect of a JBS is described in German Patent Application No. DE 10 2004 053 761 and referred to as TJBS. FIG. 2 shows a TJBS (trench junction barrier Schottky diode) of this type, which has filled-in trenches. The TJBS includes an n$^+$-type substrate 1, an n-type epilayer 2, at least two trenches 6, which are etched into n-type epilayer 2, and metal layers on the front of chip 4 as the anode electrode and on the back of chip 5 as the cathode electrode. The trenches are filled with p-doped Si or poly-Si 7. In particular, metal layer 4 may also include multiple different metal layers which lie on top of each other. For the sake of clarity, this configuration is not plotted in FIG. 2. From an electrical point of view, the TJBS is a combination of a p-n type diode (p-n junction between p-doped trenches 7 as the anode and n-type epilayer 2 as the cathode), and a Schottky diode (Schottky barrier between metal layer 4 as the anode and n-type epilayer 2 as the cathode).

As in a conventional JBS, currents flow only through the Schottky diode in the forward direction. Due to the lack of a lateral p-type diffusion, however, the effective area for current flow in the forward direction is much larger in the TJBS than in a conventional JBS. In the reverse direction, the space charge zones expand as the voltage increases and converge in the middle of the area between adjacent trenches 6 at a voltage which is lower than the breakdown voltage of the TJBS. As in the JBS, this shields the Schottky effect, which is responsible for high reverse currents, and reduces the reverse currents. This shielding effect is greatly dependent on the structural parameters of trench depth Dt, the distance between trenches Wm and trench width Wt as well as on the doping concentrations of p-type well 7 and n-type epilayer 2 (see FIG. 2).

No p-type diffusion is used to provide the trenches in the TJBS. As a result, there is no negative effect of lateral p-type diffusion, as in a conventional JBS. An approximately one-dimensional expansion of the space charge zones in the mesa area between trenches 6 may be easily implemented, since trench depth Dt, which is an important structural parameter for shielding the Schottky effect, no longer correlates with the effective area for current flow in the forward direction. The shielding action of Schottky effects is thus much more effective than in the JBS having diffused p-type wells.

On the other hand, the TJBS has a high degree of robustness, due to its clamping function. The breakdown voltage of p-n type diode BV_pn is designed in such a way that BV_pn is lower than the breakdown voltage of Schottky diode BV_schottky, and breakdown occurs at the bottom of the trenches. In breakdown mode, the reverse current then flows only through the p-n junction. The forward direction and the reverse direction are thus geometrically separated. The TJBS thus has a robustness which is similar to that of a p-n type diode. In addition, the injection of "hot" charge carriers in oxides does not occur in a TJBS, since no MOS structure exists. Consequently, the TJBS is suitable as a Zener diode for use in motor vehicle generator systems.

SUMMARY

An object of the present invention is to provide Schottky diodes which have a high degree of robustness and flexible design capabilities for meeting different requirements of breakdown voltage, leakage current and forward voltage, the Schottky diodes being suitable for use as Zener power diodes in motor vehicle generator systems.

Exemplary embodiments of Schottky diodes may have the advantage that the combination of doping concentrations in the p-type well may be flexible defined, depending on the requirements. Compared to the TJBS having a uniform doping concentration in the p-type well, this achieves a degree of flexibility in designing components. These advantages are achieved by a TJBS, i.e., a trench junction barrier Schottky diode, having a p-type well which is divided into multiple areas from top to bottom and filled with p-doped silicon or poly-Si of different doping concentrations.

DETAILED DESCRIPTION OF EXAMPLE EMBODIMENTS

In general, the shielding action of the barrier-lowering effect is better in an TJBS which has a highly doped $p^+$-type well and equal dimensions of the trenches (Wm, Wt, Dt, see FIG. 2), since the space charge zones largely expand in the low-doped n-type epilayer and an abrupt p-n junction is present. In an equal doping concentration of the n-type epilayer, this results in a lower leakage current due to the better shielding action of the barrier-lowering effect. In contrast, however, a higher forward voltage is a disadvantage. If the doping concentration of the n-type epilayer is to be designed according to the breakdown voltage requirement, the n-type epilayer must be low-doped in the presence of an abrupt p-n junction. This results in a lower leakage current as an advantage and a higher forward voltage as a disadvantage.

On the other hand, a weaker shielding action of the barrier-lowering effect is to be expected in a low-doped p-type well, since the space charge zones expand in the low-doped n-type epilayer as well as in the low-doped p-type well, which provides a graduated p-n junction. In addition, the n-type epilayer must be more highly doped, compared to an abrupt p-n junction at the same breakdown voltage requirement. The advantage of this is a lower forward voltage. The disadvantage is a higher leakage current.

In a TJBS described in German Patent Application No. DE 10 2004 053 761, a uniform doping concentration is provided in the p-type well, and the component design flexibility is therefore limited. However, if the p-type well is divided into different areas from top to bottom and flexible combinations of doping concentrations are used, i.e., a uniform concentration in the p-type well is abandoned, additional design flexibility may be obtained, and additional design flexibility may be gained and the component may be designed depending on the requirements of breakthrough voltage, leakage current and forward voltage.

Figure 3:
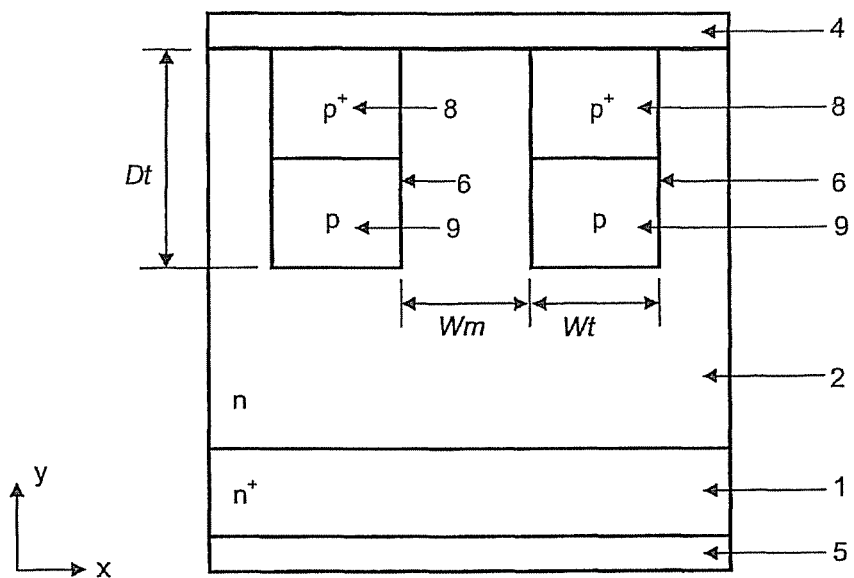
FIG. 3 shows a TJBS variant of the present invention: exemplary embodiment 1.

The first exemplary embodiment of the present invention is illustrated in FIG. 3. The TJBS variant includes an $n^+$-type substrate 1, an n-type epilayer 2, at least two trenches, which are etched into n-type epilayer 2, trenches 6 having a width Wt, a depth Dt and a distance between adjacent trenches 6 Wm and metal layers on the front of chip 4 as the anode electrode and on the back of chip 5 as the cathode electrode. The upper area of trenches 6 is filled with highly doped $p^+$ Si or $p^+$ poly-Si 8, and the lower area is filled with low-doped p Si or p poly-Si 9.

This JBS variant is again a combination of a Schottky diode which has a Schottky barrier between metal layer 4 as the anode and n-type epilayer 2 as the cathode, and a p-n type diode which has a p-n junction between the p-type well as the anode and n-type epilayer 2 as the cathode. In contrast to the TJBS illustrated in FIG. 2, the p-type well is now divided into two areas from top to bottom. The upper area of trenches 6, which has highly doped $p^+$ Si or $p^+$ poly-Si 8, represents an abrupt p-n junction, together with n-type epilayer 2, while the lower area, which has low-doped p Si or p poly-Si 9, represents a graduated p-n junction, together with n-type epilayer 2. The graduated p-n junction in the lower area of the trenches may be used to achieve a higher breakdown voltage and/or a lower forward voltage, while the abrupt p-n junction in the upper area of the trenches ensure an adequate shielding action of the barrier-lowering effect and thus a low leakage current.

Figure 4:
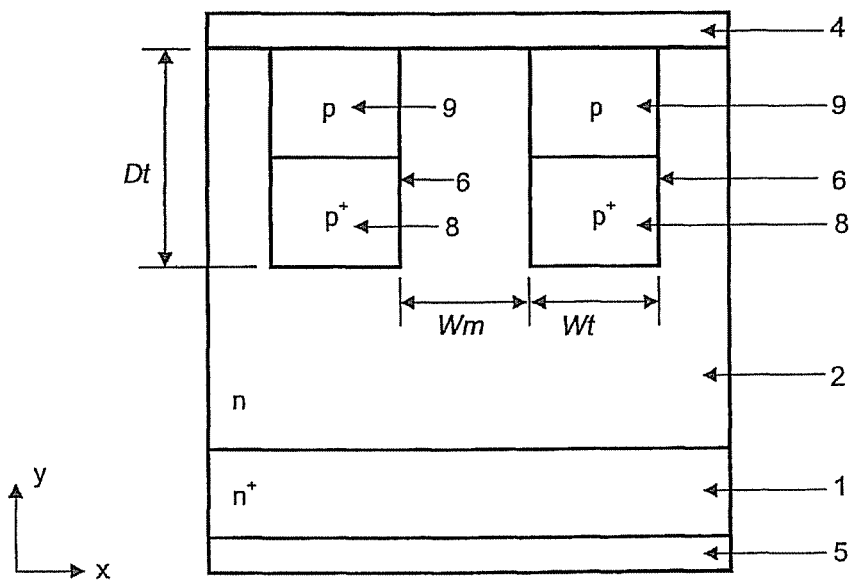
FIG. 4 shows a TJBS variant of the present invention: exemplary embodiment 2.

FIG. 4 shows the second exemplary embodiment of the present invention. The difference from the TJBS variant illustrated in FIG. 3 is the fact that the upper area of trenches 6 in this case is filled with low-doped p SI or P poly-Si 9, and the lower area is filled with highly doped $p^+$ Si or $p^+$ poly-Si 8. The upper area, which has low-doped p Si or p poly-Si 9, represents an graduated p-n junction, together with n-type epilayer 2, while the lower area of trenches 6, which has highly doped $p^+$ Si or $p^+$ poly-Si 8 represents an abrupt p-n junction, together with n-type epilayer 2. The abrupt p-n junction in the lower area of the trenches makes it possible to achieve a good shielding action of the barrier-lowering effect and thereby provide a low leakage current. Due to graduated p-n junction in the upper area of the trenches, the forward voltage increases to a lesser degree than would be the case using an entirely abrupt p-n junction. This variant is advantageous for a TJBS having a lower breakdown voltage.

Figure 5:
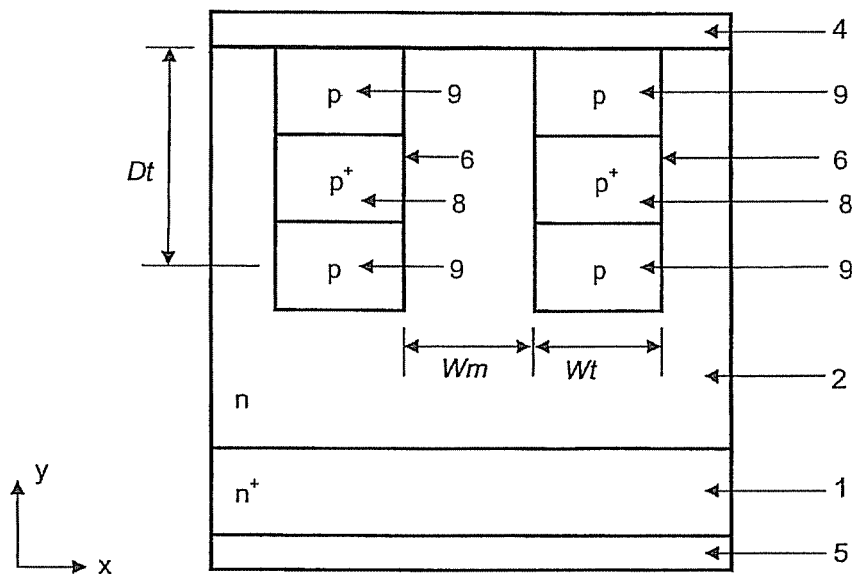
FIG. 5 shows a TJBS variant of the present invention: exemplary embodiment 3.
Figure 6:
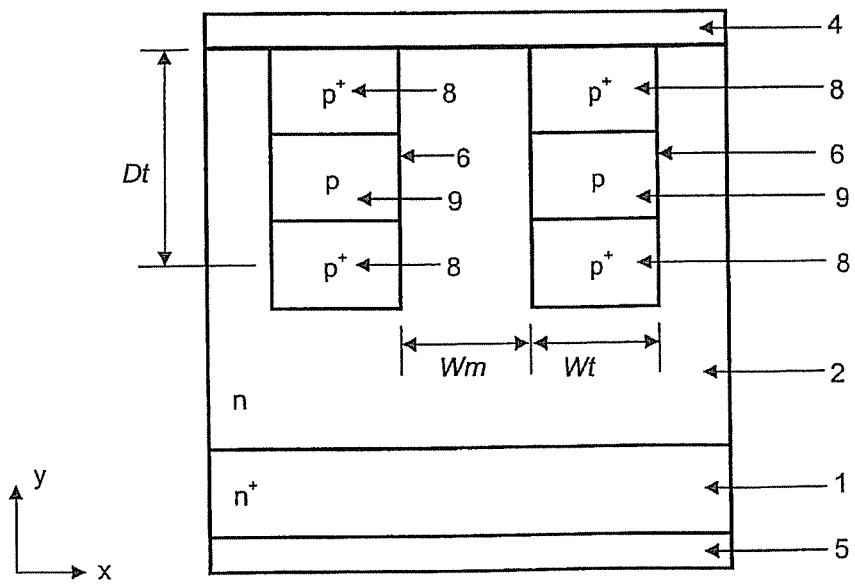
FIG. 6 shows a TJBS variant of the present invention: exemplary embodiment 4.

Additional exemplary embodiments of the present invention are illustrated in FIG. 5 and FIG. 6. In exemplary embodiment 3 in FIG. 5, the p-type well is divided into three areas from top to bottom; the middle area is filled with highly doped $p^+$ Si or $p^+$ poly-Si 8, and the upper and lower areas are filled with low-doped p Si or p poly-Si 9.

In exemplary embodiment 4 in FIG. 6, the p-type well is also divided into three areas from top to bottom. The middle area is filled with low-doped p Si or p poly-Si 9, and the upper and lower areas are filled with highly doped p$^+$ Si or p$^+$ poly-Si 8. Compared to the TJBS variants illustrated in FIGS. 3 and 4, the two exemplary embodiments provide even greater flexibility in designing components, while minimizing additional process control complexity. In the TJBS variants of the present invention, currents flow only through the Schottky diode in the forward direction, as in a conventional JBS or TJBS, if the forward voltage of the TJBS variant according to the present invention is substantially lower than the forward voltage of the p-n type diode.

Figure 1:
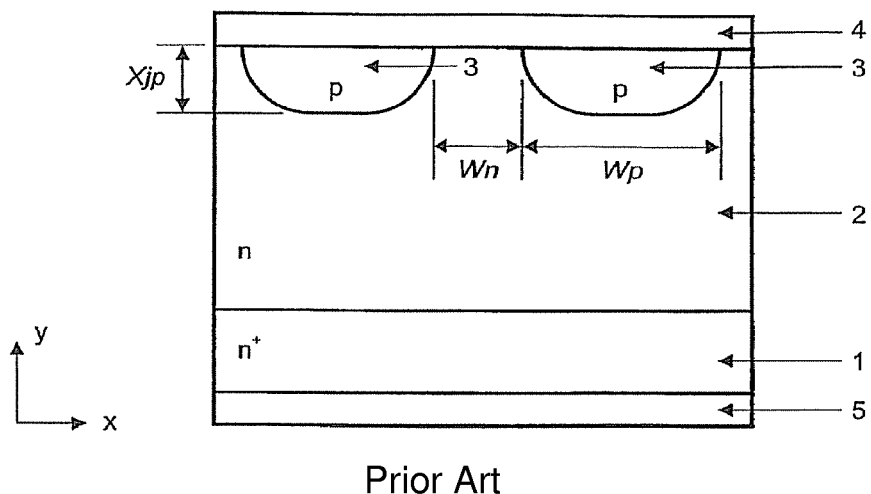
FIG. 1 shows a JBS (junction barrier Schottky diode).
Figure 2:
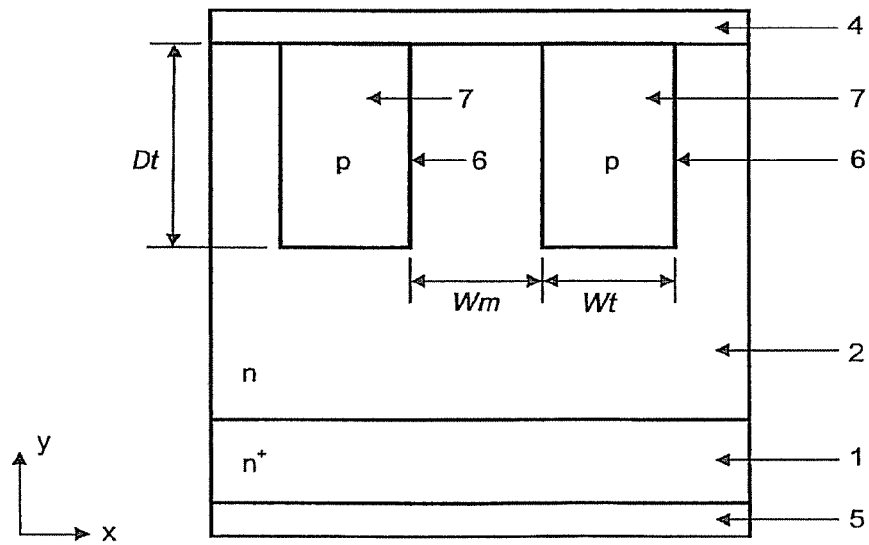
FIG. 2 shows a TJBS (trench junction barrier Schottky diode) having filled-in trenches.

The TJBS variants according to the present invention provide a high degree of robustness due to the clamping function, as in the case of a TJBS illustrated in FIG. 2. The breakdown voltage of p-n type diode BV_pn is designed in such a way that BV_pn is lower than the breakdown voltage of Schottky diode BV_schottky, and breakdown occurs at the p-n junction between the lower area of the p-type wells and n-type epilayer 2. In breakdown mode, the reverse currents flow only through the p-n junction. The TJBS variants according to the present invention thus have a robustness which is similar to that of a p-n type diode. Compared to the TJBS having a uniform doping concentration in the p-type well, the TJBS variants according to the present invention advantageously provide greater flexibility for designing components, due to the division of the p-type well into multiple areas from top to bottom. This makes it possible to more effectively and more flexibly meet requirements such as those of breakdown voltage, leakage current and forward voltage.

An example method for manufacturing TJBS variants according to the present invention includes the following steps:

n$^+$-type substrate as the source material;
n-type epitaxy;
Trench etching;
Filling the trenches with highly p'-doped or low p-doped Si or poly-Si according to the design of the doping combination of the p-type well;
Diffusion of a thin p$^+$-type layer in the upper area of the trenches, as needed;
Metallization on the front and back.

In the TJBS variants according to the present invention, additional structures may be provided in the edge area of the chips for reducing the marginal field intensity. These structures may be, for example, low-doped p-type areas, magnetoresistors or similar conventional structures.

What is claimed is:

1. A semiconductor system, comprising:
   an n$^+$-type substrate;
   an n-type epilayer which is located on the n$^+$-type substrate and acts as a cathode zone; and
   a trench junction barrier Schottky diode having an integrated p-n type diode as a clamping element;
   wherein:
   the trench junction barrier Schottky diode is a combination of a Schottky diode and a p-n type diode;
   a breakdown voltage of the p-n type diode is lower than a breakdown voltage of the Schottky diode;
   at least two trenches are etched into the n-type epilayer and form an anode zone of the p-n type diode; and
   the trenches are each divided into a respective upper area filled with highly-doped p$^+$ Si or p$^+$ poly-Si, a respective middle area filled with low-doped p Si or p poly-Si, and a respective lower area filled with highly-doped p$^+$ Si or p$^+$ poly-Si.

2. The semiconductor system as recited in claim 1, wherein the breakdown voltage of the semiconductor system is in a range of 20V and designed in such a way that it acts as a Zener diode and may be operated using high currents at breakdown.

3. The semiconductor system as recited in claim 1, wherein the high and low doping concentrations have a doping gradient within high doped or low-doped areas.

4. The semiconductor system as recited in claim 1, wherein:
   the substrate and n-type epilayer are part of a chip;
   a metal layer is located on a back of the chip and acts as a cathode electrode; and
   a metal layer is situated on a front of the chip, has an ohmic contact to a p-type well formed from the filled trenches, has a Schottky contact to the n-type epilayer and acts as an anode electrode.

5. The semiconductor system as recited in claim 1, wherein the trenches have one of a rectangular shape, a U shape, and a selectable shape.

6. The semiconductor system as recited in claim 4, wherein a breakdown of the p-n type diode takes place at a junction between a lower area of the p-type well and the n-type epilayer.

7. The semiconductor system as recited in claim 4, wherein metallization of the metal layer on at least one of the back of the chip and the front of the chip includes at least two metal layers which lie on top of each other.

8. The semiconductor system as recited in claim 4, wherein the trenches are situated one of in a strip configuration and as islands, the islands having one of a circular design and a hexagonal design.

9. The semiconductor system as recited in claim 1, wherein a contact of the Schottky diode is made of one of nickel or nickel silicide.

10. The semiconductor system as recited in claim 1, wherein the semiconductor system is part of a rectifier for a motor vehicle generator system.

11. A method for manufacturing a semiconductor system, comprising:
    providing an n$^+$-type substrate as a source material;
    forming an n-type epilayer via n-type epitaxy;
    etching trenches in the n-type epilayer;
    with respect to each of the trenches:
        filling an upper area of the respective trench with highly-doped p$^+$ Si or p+ poly-Si;
        filling a middle area of the respective trench with low-doped p Si or p poly-Si; and
        filling a lower area of the respective trench with highly-doped p+ Si or p+ Poly-Si;
    diffusing a thin p$^+$-type layer in an upper area of the trenches; and
    metallizing on a front and a back of the semiconductor system.

* * * * *